US005784020A

United States Patent [19]

Inoue

[11] Patent Number: 5,784,020

[45] Date of Patent: Jul. 21, 1998

[54] ANALOG-TO-DIGITAL CONVERTING DEVICE FOR INCREASING THE NUMBER OF ANALOG INPUT CHANNELS

[75] Inventor: Hideo Inoue, Hyogo, Japan

[73] Assignees: Mitsubishi Denki Kabushiki Kaisha, Tokyo; Mitsubishi Electric Semiconductor Sofware Co., Ltd., Hyogo, both of Japan

[21] Appl. No.: 915,587

[22] Filed: Aug. 21, 1997

Related U.S. Application Data

[63] Continuation of Ser. No. 532,316, Sep. 21, 1995, abandoned.

[30] Foreign Application Priority Data

May 12, 1995 [JP] Japan .................................... 7-114431

[51] Int. Cl.[6] .................................................... H03M 1/12

[52] U.S. Cl. ............................................ 341/141; 341/155

[58] Field of Search ..................................... 341/141, 155

[56] References Cited

FOREIGN PATENT DOCUMENTS 4242436 6/1993 Germany .

*Primary Examiner*—Jeffrey A. Gaffin
*Assistant Examiner*—Kim N. Huynh
*Attorney, Agent, or Firm*—McDermott, Will & Emery

[57] ABSTRACT

An analog-to-digital (A/D) converting device which substantially increases the number of input channels without increasing the number of input terminals. When an external channel selecting circuit is asserted "low", switches are selected to deliver a 3-bit control word to a decode circuit. The decode circuit delivers a corresponding analog signal to a multiplexer in accordance with the control word. An A/D converter converts the analog signal to a digital signal. When the external channel selecting circuit is asserted "high", switches deliver a 3-bit channel control word to an output terminal. Simultaneously, the "high" signal from the external channel selecting circuit is applied to an OR gate, which in turn is applied to a multiplexer. An externally inputted analog signal is also applied to the multiplexer. The inputted analog signal is applied to an A/D converter, via the multiplexer, and the analog signal is converted to a digital signal. Therefore, since the device can process an analog signal input through an external channel input terminal selected by the channel control word and then the predetermined analog input terminal, it makes it possible to substantially increase the number of analog input channels without increasing the number of the built-in analog input terminals.

19 Claims, 8 Drawing Sheets

ANALOG-TO-DIGITAL CONVERTING DEVICE FOR INCREASING THE NUMBER OF ANALOG INPUT CHANNELS

This application is a continuation of application Ser. No. 08/532,316 filed Sep. 21, 1995, now abandoned.

BACKGROUND OF THE INVENTION

1. Field of the Invention

The present invention relates to an analog-to-digital converting device which can substantially increase the number of analog input channels without increasing the number of analog input terminals.

2. Description of the Prior Art

Referring now to FIG. 9, it illustrates a block diagram showing the structure of a prior art analog-to-digital converting device. In the figure, reference numeral 1 denotes a plurality of analog input terminals, 2 denotes a multiplexer, 4 denotes an analog-to-digital converter, 5 denotes a semiconductor integrated circuit such as a microprocessor including the multiplexer 2 and A/D converter 4 embedded therein, and S0–S7 denote internal channel selecting signals. In this example, the analog-to-digital converting device is provided with eight analog input terminals 1 and signal lines through which eight corresponding built-in channel selecting signals S0–S7 are transmitted to manipulate eight channels of analog inputs.

In operation, when any one of the internal channel selecting signals S0–S7 is activated and input to the multiplexer 2, one corresponding analog input terminal is selected from among the plurality of analog input terminals 1. Then, the A/D converter 4 converts an analog signal input through the selected analog input terminal 1 into a digital signal. In scan mode, the built-in channel selecting signals S0–S7 are sequentially applied to the multiplexer 2 and analog signals present at the plurality of analog input terminal 1 are sequentially converted into digital signals.

Since the prior art analog-to-digital converting device has the structure mentioned above, the number of the analog input terminals for the analog-to-digital converter is restricted by the number of the analog input terminals 1 disposed for the semiconductor integrated circuit. The number of analog input channels is not variable and therefore it has been necessary to prepare several kinds of semiconductor integrated circuits with different numbers of analog input terminals 1 in response to the need for various types of semiconductor integrated circuits.

SUMMARY OF THE INVENTION

It is therefore an object to provide an analog-to-digital converting device which can substantially increase the number of analog input channels without physically increasing the number of analog input terminals.

In accordance with the present invention, there is provided an analog-to-digital converting device comprising a decode circuit which decodes a channel control word for selecting one input channel from among a plurality of input channels to produce a corresponding channel selecting signal, a multiplexer which selects one analog input terminal from among a plurality of analog input terminals according to the channel selecting signal output by the decode circuit to transfer an analog signal applied to the selected analog input terminal for analog-to-digital conversion, and an external channel control mechanism, responsive to an external channel selecting signal applied thereto, for changing the destination of the channel control word from the internal decode circuit to outside the analog-to-digital converting device and for controlling the multiplexer so as to select one predetermined analog input terminal from among the plural analog input terminals for analog-to-digital conversion.

In operation, when the external channel control mechanism receives the external selecting signal, it changes the destination of the channel control word, which is usually delivered to the internal decode circuit, to outside the analog-to-digital converting device. Then, the external channel control mechanism controls the multiplexer to select the predetermined analog input terminal from among the plurality of analog input terminals, so that the device receives an analog signal applied to the selected analog input terminal as an input for analog-to-digital conversion and converts it into a digital signal. Therefore, since the analog-to-digital converting device can process an analog signal input through an external channel input terminal selected by the channel control word and then the predetermined analog input terminal, it makes it possible to substantially increase the number of analog input channels without increasing the number of the built-in analog input terminals.

In accordance with a preferred embodiment of the present invention, a bit of a channel selecting register which determines the logical states of the bits of the channel control word is assigned to a data for controlling the logical state of the external channel selecting signal. Whether or not the external channel selecting signal is delivered to the external channel control mechanism depends on the data in the bit. Therefore, the control of the logical state of the bit in the channel selecting register can automatically switch from the built-in analog input terminals to the external channel input terminals, through which analog signals are input and they are sent to the A/D converter by way of the predetermined internal analog input terminal. This control makes it possible to perform a continuous scanning for greater numbers of channels than were scanned by the prior art analog-to-digital converting device mentioned above.

Also, in a preferred embodiment of the present invention, the analog-to-digital converting device comprises a control input terminal which receives the external channel selecting signal. It is therefore not necessary to produce the external channel selecting signal by a software program.

According to a preferred embodiment of the present invention, the analog-to-digital converting device comprises a plurality of A/D converted result storing register, the number of which are equal to the number of the analog input terminals. Furthermore, a bit of each of the plural A/D converted result storing registers is assigned to a data for showing whether or not each A/D converted result stored in each A/D converted result storing register is converted from an analog signal applied to the predetermined analog input terminal under control of the external channel control mechanism. Checking the logical state of the bit, the device can gain a knowledge about through which channel, i.e., either an internal channel or an external channel, the analog signal which corresponds to the analog-to-digital converted result is input. It is therefore not necessary to monitor through which channel analog signals, which correspond to digital data in the A/D converted result storing registers, are input by a software program.

Also, in a preferred embodiment of the present invention, the analog-to-digital converting device comprises a plurality of A/D converted result storing registers, the number of which are equal to the number of the analog input terminals. Furthermore, a plurality of bits of each of the plural A/D converted result storing registers are assigned to a data for showing whether or not each A/D converted result stored in each A/D converted result storing register is converted from an analog signal applied to the predetermined analog input terminal under control of the external channel control mechanism and data for showing the logical states of the bits of the channel control word. Checking the logical states of these bits, the device can gain a knowledge about the number of a channel through which each analog signal is input as well as through which channel, i.e., either an internal channel or an external channel, the analog signal which corresponds to the analog-to-digital converted result is input. It is therefore not necessary to monitor through which channel analog signals, which correspond to digital data in the A/D converted result storing registers, are input by a software program.

According to a preferred embodiment of the present invention, the analog-to-digital converting device further comprises an A/D successive approximations register for storing an A/D converted result, a plurality of bits of the A/D successive approximations register being assigned to a data for showing whether or not an A/D converted result stored in the A/D successive approximations register is converted from an analog signal applied to the predetermined analog input terminal under control of the external channel control mechanism and data for showing the logical states of the bits of the channel control word. Furthermore, the A/D converted result and data are transferred to one corresponding A/D converted result storing register, just as they are. Checking the logical states of these bits, the device can gain a knowledge about the number of a channel through which each analog signal is input as well as through which channel, i.e., either an internal channel or an external channel, the analog signal which corresponds to the analog-to-digital converted result is input. It is therefore not necessary to monitor through which channel analog signals, which correspond to digital data in the A/D converted result storing registers, are input by a software program.

In a preferred embodiment of the present invention, the analog-to-digital converting device further comprises output terminals for receiving the channel control word under control of the external channel control mechanism and for delivering the bits of the word in parallel with each other to outside the device. Therefore, it is not necessary to provide a circuit for converting the channel control word, typically composed of a plurality of bits, into a continuous sequence of signals. Alternatively, the analog-to-digital converting device includes an output mechanism which receives the channel control word under control of the external channel control mechanism and sequentially delivers the bits of the word to outside the device. Thereby, the number of the output terminals can be decreased.

Furthermore, according to the present invention, there is provided an analog-to-digital converting device comprising a first decode circuit which decodes a channel control word for selecting one input channel from among a plurality of input channels to produce a corresponding channel selecting signal, a second decode circuit which decodes the channel control word to produce and deliver a corresponding channel selecting signal to outside the device by way of at least one output terminal, a multiplexer which selects one analog input terminal from among a plurality of analog input terminals according to the channel selecting signals output by the first decode circuit to transmit an analog signal applied to the selected analog input terminal for analog-to-digital conversion, and an external channel control mechanism, responsive to an external channel selecting signal applied thereto, for changing the destination of the channel control word from the first decode circuit to the second decode circuit and for controlling the multiplexer so as to select one predetermined analog input terminal from among the plural analog input terminals for analog-to-digital conversion.

In operation, when the external channel control mechanism receives the external selecting signal, it changes the destination of the channel control word, which is usually delivered to the first decode circuit, to the second decode circuit. Then, the external channel control mechanism controls the multiplexer to select the predetermined analog input terminal from among the plurality of analog input terminals, so that the device receives an analog signal applied to the selected analog input terminal as an input for analog-to-digital conversion and converts it into a digital signal. Therefore, it is not necessary to provide an external device disposed outside the analog-to-digital converting device with another decode circuit.

Further objects and advantages of the present invention will be apparent from the following description of the preferred embodiments of the invention as illustrated in the accompanying drawings.

DETAILED DESCRIPTION OF THE PREFERRED EMBODIMENTS

Figure 1:
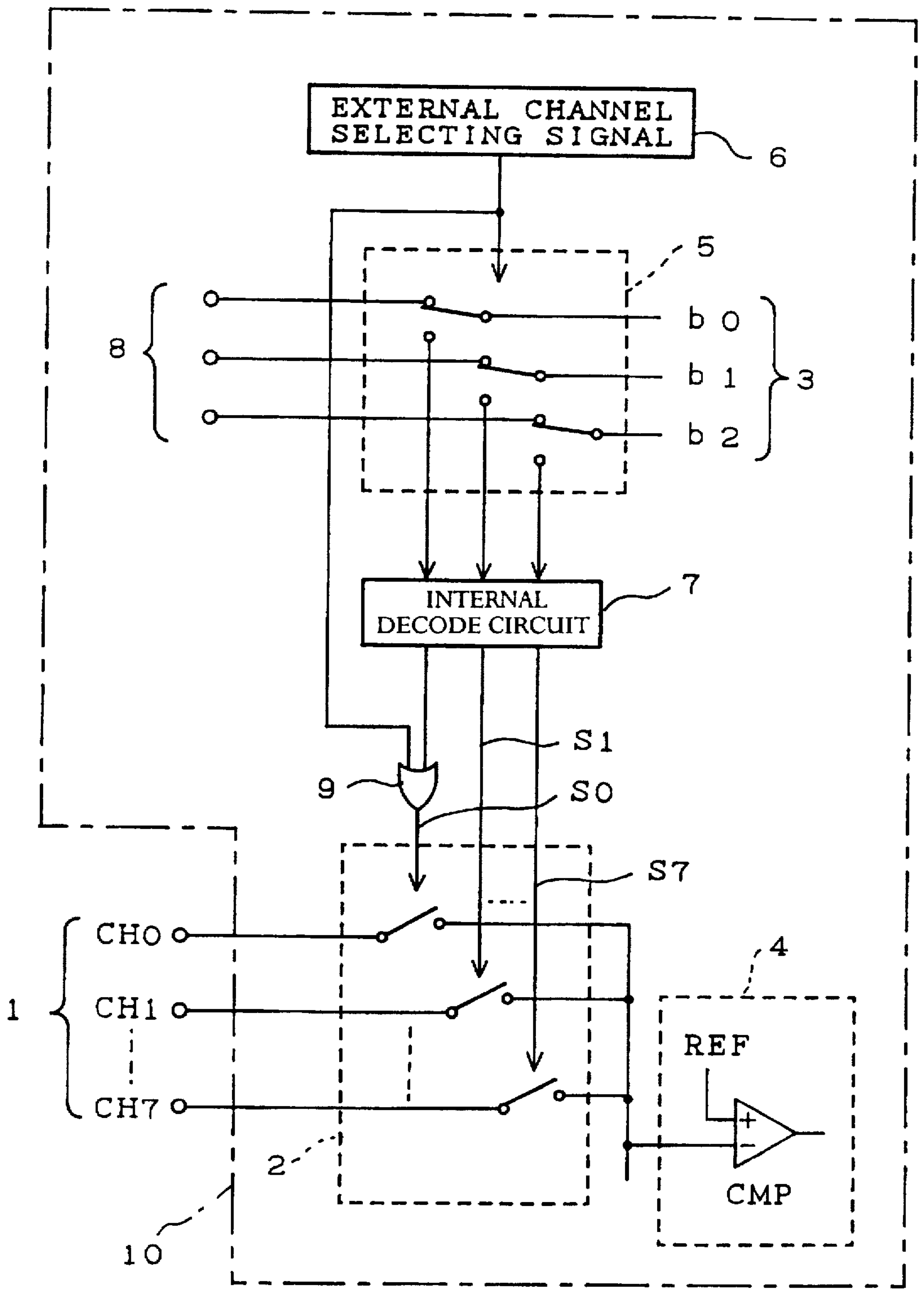
FIG. 1 shows a block diagram of an analog-to-digital converting device according to the first embodiment of the present invention.

Referring now to FIG. 1, it illustrates a block diagram showing the structure of an analog-to-digital converting device according to the first embodiment of the present invention. In the figure, reference numeral 1 denotes a plurality of analog input terminals, 2 denotes a multiplexer which selects any one from among the plurality of analog input terminals 1, 3 denotes a channel control word composed of plural bits for selecting one channel of the multiplexer 2 to finally select any one input terminal from among the plurality of analog input terminals 1, 4 denotes A/D converter which receives and converts an analog signal passing through one of the plural analog input terminals 1 and one channel of the multiplexer 2 into a digital signal, 5 denotes switches for delivering the channel control word 3 to a decode circuit (not shown in the figure), which is disposed outside the A/D concerting device, with a plurality of external analog input terminals which are different from the built-in plural analog input terminals 1, 6 denotes an external channel selecting signal for switching between ON and OFF states of the switches 5 to control the delivery of the channel control word 3 to either the internal decode circuit or an external decode circuit (not shown) disposed outside and for turning on a switch of the multiplexer 2 connected to a predetermined channel, e.g., the channel CH0, 7 denotes a built-in internal decode circuit for decoding the channel control word passing through the switches 5, when the built-in input channels are used for analog-to-digital conversion, to output any one of the built-in channel selecting signals S0–S7 which turns on any one of the switches of the multiplexer 2, 8 denotes a channel control word output terminal for receiving the channel control word 3 from the switches 5 which are turned on by the external channel selecting signal 6 and for delivering it to the decode circuit disposed outside the semiconductor integrated circuit, 9 denotes an OR gate, and 10 denotes an analog-to-digital converting device constructed by the semiconductor integrated circuit including the plural analog input terminals 1, multiplexer 2, A/D converter 4, switches 5, internal decode circuit 7, channel control word output terminal 8, and OR gate 9, all of which are embedded therein.

Next, the description will be directed to an operation of the analog-to-digital converting device. When the external channel selecting signal 6 is not asserted, e.g., at a low logical state, the switches 5 are switched to deliver the 3-bit channel control word 3 to the internal decode circuit 7. The channel control word 3, which has been determined by a software program or the like, is supplied to the internal decode circuit 7 by way of the switches 5. Then, the decode circuit 7 delivers a corresponding one of the built-in channel selecting signals S0–S7 to a switch of the multiplexer 2 in accordance with the channel control word 3. The selected switch of the multiplexer is turned on and therefore a corresponding one of the analog input terminal 1 is electrically connected to the input terminal of the A/D converter 4. The A/D converter 4 converts an analog signal which is input through the selected analog input terminal 1 into a digital signal. In this manner, analog signals present at the plural built-in analog input terminals 1 can be sequentially converted into digital signals.

On the other hand, when the external channel control word 6 is asserted High, the switches 5 are switched to deliver the 3-bit channel control word 3 to the channel control word output terminal 8. In this case, none of the built-in channel selecting signals S0–S7 is delivered from the internal decode circuit 7 to the multiplexer 2. Simultaneously, the external channel selecting signal 6 is applied to one input terminal of the OR gate 9. A high logical level signal is output from the OR gate 9 and is then applied to the channel CH0 switch of the multiplexer 2 so as to switch it on. Furthermore, one external analog input terminal is selected from among the plural external analog input terminals which are included in the outside decode circuit (not shown in FIG. 1) and an analog signal present at the selected external analog input terminal is input to the channel CH0 of the analog input terminals 1. The analog signal is further input to the A/D converter 4 by way of the multiplexer 2. Thus, the A/D converter 4 converts the analog signal, which is applied to one external analog input terminal disposed outside the device and then is delivered thereto through the predetermined analog input, into a digital signal. In this manner, the analog-to-digital converting device of this embodiment converts analog signals applied to the external analog input terminals disposed outside the semiconductor integrated circuit as external channels by means of one predetermined channel of the analog input terminals 1 included in the device as a built-in channel.

The logical state of the external channel selecting signal 6 is controlled by a software program. The software program causes the external channel selecting signal 6 to transition to its high logical state when converting an analog signal present at one external analog input terminal included in the external device into a digital signal. Instead, the software program causes the external channel selecting signal 6 to transition to its low logical state when converting an analog signal present at one built-in analog input terminal 1 into a digital signal.

Figure 2:
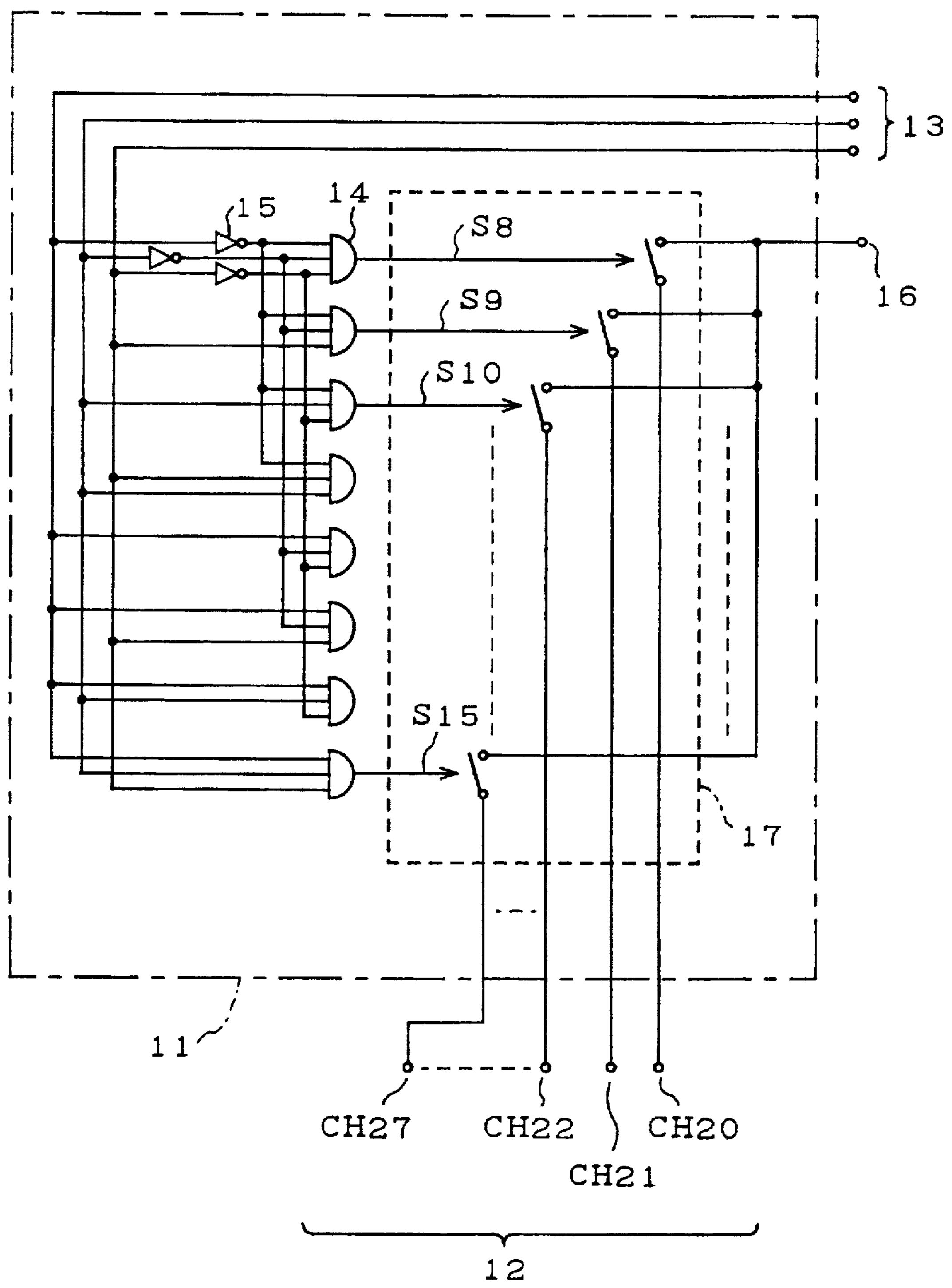
FIG. 2 shows a block diagram of an example of a an external decode circuit disposed outside the analog-to-digital converting device.

Referring now to FIG. 2, it illustrates an example of the decode circuit disposed outside the analog-to-digital converting device. In the figure, reference numeral 11 denotes the external decode circuit, 12 denotes a plurality of external analog input terminals, 13 denotes an external channel control word input terminal which receives the 3-bit channel control word output from the channel control word output terminal 8 of the analog-to-digital converting device 10 shown in FIG. 1, 14 denotes an AND gate, 15 denotes an inverter, 16 denotes an analog signal output terminal, and 17 denotes switches for electrically connecting one of the external analog input terminals 12 with the analog signal output terminal 16 according to a corresponding one of the external channel selecting signals S8–S15 delivered by a corresponding AND gate 14. The analog signal output terminal 16 is connected with the channel CH0 of the analog input terminals 1 disposed in the analog-to-digital converting device 10 shown in FIG. 1.

Next, the description will be directed to the operation of the decode circuit 11. As previously mentioned, when the external channel selecting signal 6 is asserted High, the 3-bit channel control word is output from the channel control word output terminal 8 of the analog-to-digital converting device 10 and then the external decode circuit 11 receives the signal with the external channel control word input terminal 13. The decode circuit 11 delivers a corresponding one of the external channel selecting signal S8–S15 to one of the switches 17 so as to choose one external channel in accordance with the channel control word. The external channel selecting signal switches on one of the switches 17 to electrically connect the corresponding one of the external analog input terminals 12 with the analog signal output terminal 16. In this manner, the external decode circuit 11 outputs an analog signal input through an external analog input terminal 12 to the channel CH0 of the analog input terminals 1 of the analog-to-digital converting device 10 by way of the analog signal output terminal 16. In the analog-to-digital converting device 10, the external channel selecting signal 6 is simultaneously input into one input terminal of the OR gate 9 and hence a high state output signal is delivered by the OR gate 9 and applied to the switch of the multiplexer 2 which is connected to the channel CH0. This results in turning on this switch. Thus, an external channel analog signal present at the channel CH0 of the analog input terminals 1 is input into the A/D converter 4. Finally, the A/D converter 4 converts the analog signal, which is input through one of the external analog input terminals 12, into a digital signal.

Therefore, the analog-to-digital converting device 10 according to this embodiment makes it possible to substantially increase the number of analog input channels by processing an analog signal which is input through one of the external analog input terminals 12 and then input by way of the predetermined analog input terminal, without increasing the number of the internal analog input terminals 1. This results in eliminating the need for providing various types of microprocessors including different analog-to-digital converting devices in accordance with the needs of users, e.g., microprocessors intended for control of engines for use in various types of motor vehicles. That is, providing one variety of microprocessor including the analog-to-digital converting 10 according to this embodiment is all that is needed to respond consumer needs.

As mentioned above, according to this embodiment the external decode circuit 11, to which the analog-to-digital converting device 10 delivers the channel control word 3, is disposed as an external device as shown in FIG. 2. Alternatively, a portion including the plural AND gates 14 and plural inverters 15 except the external analog input terminals 12, analog signal output terminal 16 and switches 17 may be disposed within the integrated circuits constructing the analog-to-digital converting device 10. In this case, the analog-to-digital converting device 10 is provided with an output port through which the external channel selecting signals S8–S15 of FIG. 2 are output. This makes it possible to simplify the structure of the external device which receives the external channel selecting signals S8–S15.

Figure 3:
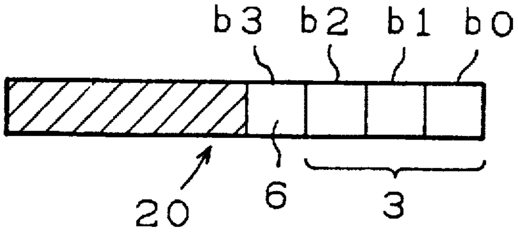
FIG. 3 shows a schematic diagram of a channel selecting register disposed in an analog-to-digital converting device according to the second embodiment of the present invention.

Referring now to FIG. 3, it illustrates a channel selecting register for storing a binary data, which determines the logical states of the bits of the 3-bit channel control word 3 and external channel selecting signal 6, disposed in an analog-to-digital converting device according to the second embodiment of the present invention. In the figure, like elements are designated by the same reference numerals as those in FIG. 1 and the explanation of them will not be repeated. Additionally, the channel selecting register is designated by reference numeral 20. The structure of the analog-to-digital converting device is the same as that of the first embodiment shown in FIG. 1 and the operation with the internal or external channels of the second embodiment is the same as that of the first embodiment, and therefore the description of these will be avoided hereinafter.

Next, the description will be directed to the operation of the channel selecting register. In the channel selecting register 20, there are provided a bit b3 which controls the external channel selecting signal 3 and bits b0–b2 which control the channel control word 3. In scan mode, when the bit b3 of the channel selecting register 20 is set to logical state 0 and the bits (b0,b1,b2) are scanned from logical states (0,0,0) to logical states (1,1,1), the analog-to-digital converting device 10 captures analog signals present at the channels CH0–CH7 of the analog input terminals 1 sequentially and then converts them into digital signals. Next, when the bit b3 of the channel selecting register 20 is set to logical state 1 and the bits (b0,b1,b2) are scanned from logical states (0,0,0) to logical states (1,1,1), the analog-to-digital converting device 10 sequentially captures analog signals present at the external channels CH20–CH27 of the external analog input terminals 12 by way of the built-in channel CH0 of the analog input terminals 1 and then converts them into digital signals if the analog-to-digital converting device 10 is connected to the external decode circuit 11 shown in FIG. 2.

In this manner, the analog-to-digital converting device according to this embodiment can automatically switch from the internal channels to the external channels by controlling the logical state of the bit b3 of the channel selecting register 20 and perform a 16-channel scanning even though it has only eight built-in analog input terminals.

Figure 4:
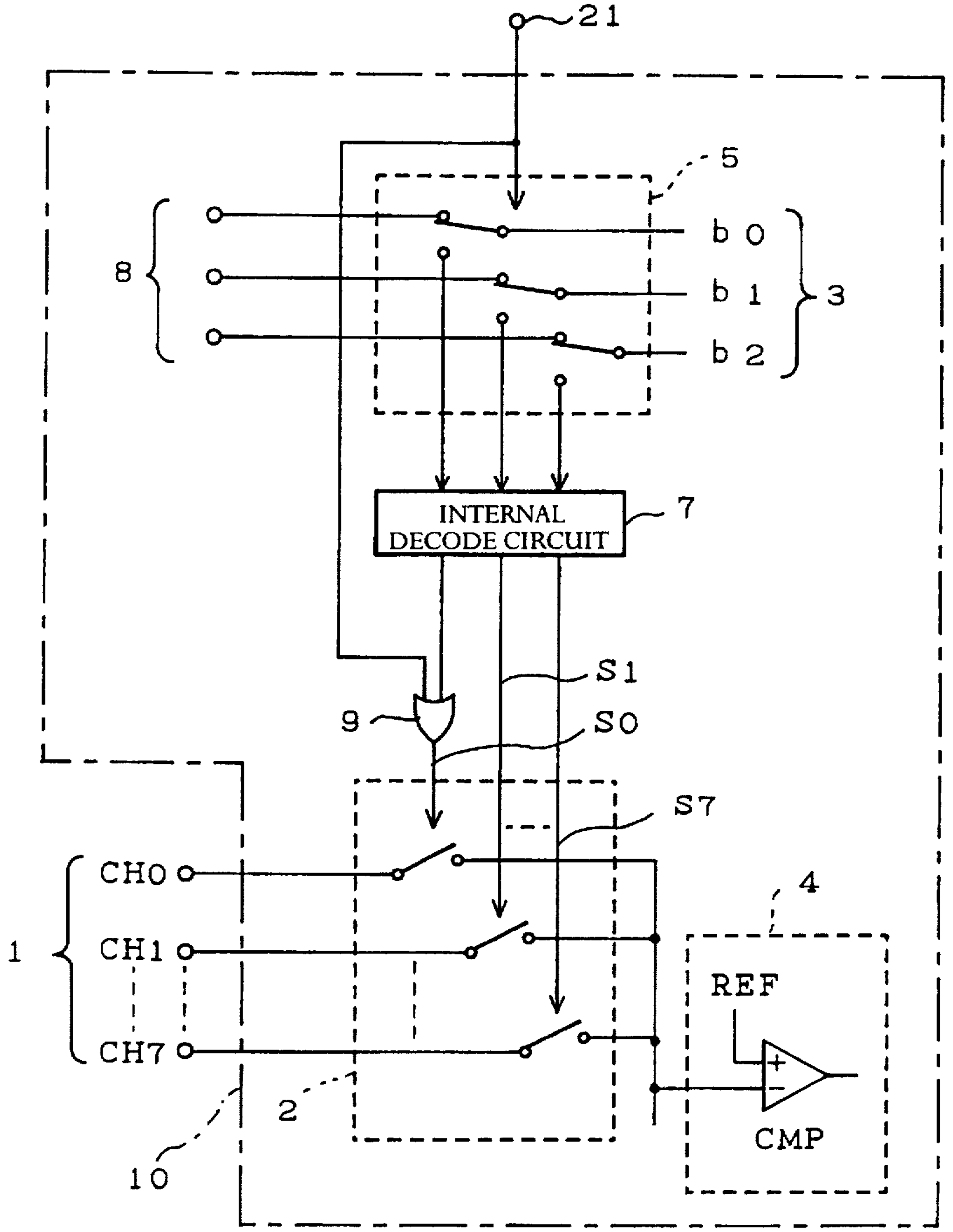
FIG. 4 shows a block diagram of an analog-to-digital converting device according to the third embodiment of the present invention.

Referring now to FIG. 4, it illustrates a block diagram showing the structure of an analog-to-digital converting device according to the third embodiment of the present invention. In the figure, like elements are designated by the same reference numerals as those in FIG. 1 and the explanation of them will not be repeated. Additionally, reference numeral 21 denotes a control input terminal which receives the external channel selecting signal 6 applied thereto. According to this embodiment the structure of the analog-to-digital converting device is the same as that of the first embodiment shown in FIG. 1 and the operation with the internal or external channels is the same as that of the first embodiment, and therefore the description of these will be avoided hereinafter.

In the first embodiment, the software program determines the logical state of the external channel selecting signal 6, whereas, according to this embodiment, the analog-to-digital converting device selects either an analog signal present at an internal channel or an analog signal present at an external channel in accordance with the logical state of the external channel selecting signal 6 input through the control input terminal 21. Thereby, the load on the software program which controls the operation of the analog-to-digital converting device can be decreased.

Figure 5:
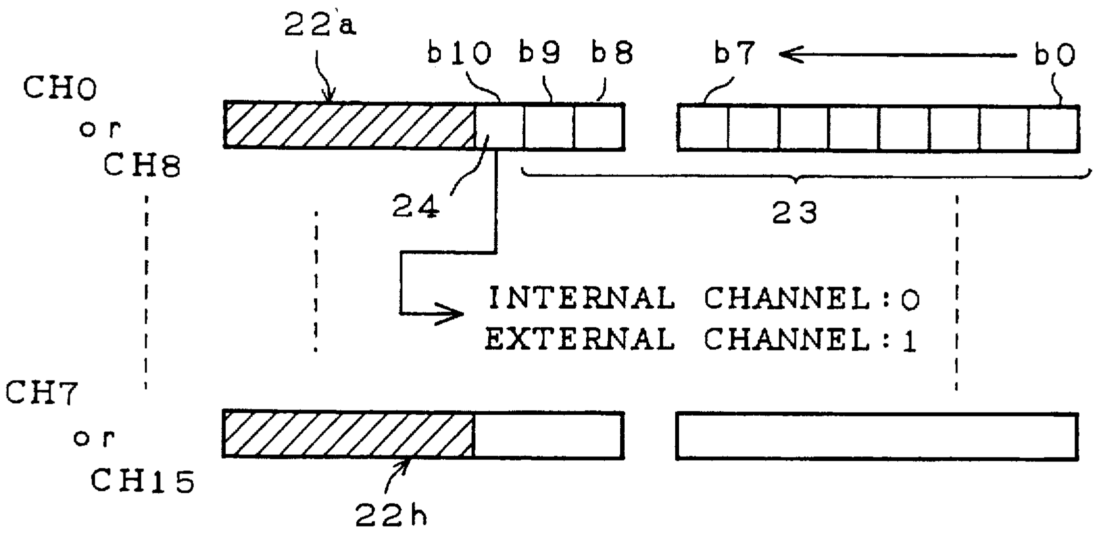
FIG. 5 shows a schematic diagram of A/D converted result storing registers disposed in an analog-to-digital converting device according to the fourth embodiment of the present invention.

Referring now to FIG. 5, it illustrates a schematic diagram showing the structure of A/D converted result storing registers in an analog-to-digital converting device according to the fourth embodiment of the present invention. In the figure, reference numerals 22a–22h denote 8 channels of A/D converted result storing registers, 23 denotes A/D converted result bits, and 24 denotes an external channel indicating bit showing whether or not a corresponding converted digital data is input through an external channel. According to this embodiment the structure of the analog-to-digital converting device is the same as that of the first embodiment shown in FIG. 1 and the operation with the internal or external channels is the same as that of the first embodiment, and therefore the description of these will be avoided hereinafter.

In the operation by use of the built-in channels, since the analog-to-digital converting device 10 has the eight A/D converted result storing registers 22a–22h which respectively correspond to the 8-channel internal analog input terminals 1, digital data converted from analog signals present at the channels CH0–CH7 are stored in the A/D converted result bits 23 of the A/D converted result storing registers 22a–22h, respectively. Simultaneously, the external channel indicating bit 24 of each of the A/D converted result storing registers 22a–22h is set to logical state 0 so as to indicate that a stored digital data in each A/D converted result storing register is converted from an analog signal present at a corresponding internal channel. On the other hand, when an analog signal input through one channel of the external analog input terminals 12 shown in FIG. 2 is converted into a digital signal, the external channel indicating bit 24 of a corresponding one of the A/D converted result storing registers 22a–22h is set to logical state 1 and the converted result is stored in the A/D converted result bits 23 of the A/D converted result storing register.

Thus, the analog-to-digital converting device according to this embodiment can eliminate the need for monitoring through which channel an analog signal which corresponds to an A/D converted result is input by means of a software program because it can gain a knowledge about through which channel, i.e., either an internal channel or an external channel, an analog signal which corresponds to an A/D converted result is input, by checking the logical state of the-external channel indicating bit 24.

Figure 6:
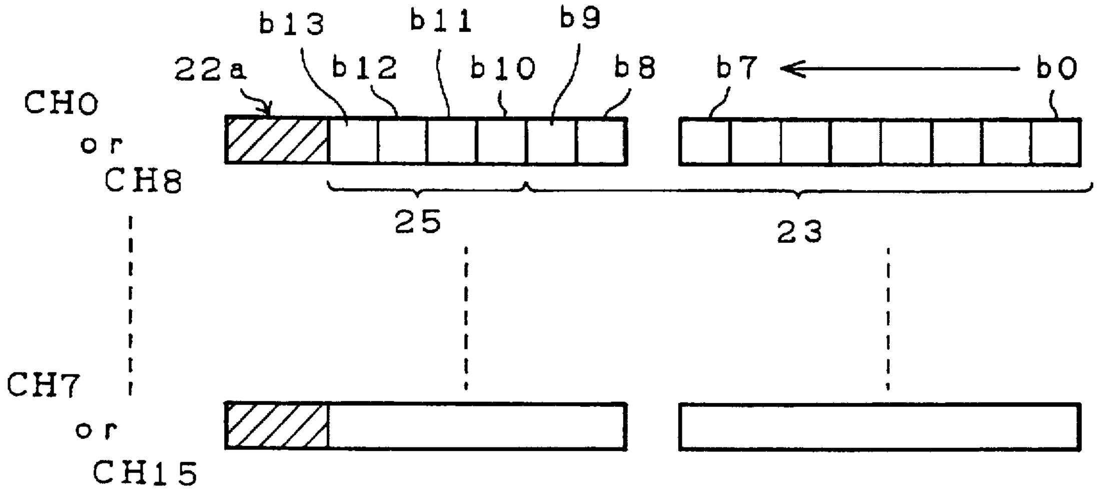
FIG. 6 shows a schematic diagram of A/D converted result storing registers disposed in an analog-to-digital converting device according to the fifth embodiment of the present invention.

Referring now to FIG. 6, it illustrates a schematic diagram showing the structure of A/D converted result storing registers in an analog-to-digital converting device according to the fifth embodiment of the present invention. In the figure, like elements are designated by the same reference numerals as those in FIGS. 1 and 5 and hence the explanation of them will not be repeated. Additionally, reference numeral 25 denotes 4-bit converted channel indicating bits. According to this embodiment the structure of the analog-to-digital converting device is the same as that of the first embodiment shown in FIG. 1 and the operation with the internal or external channels is the same as that of the first embodiment, and therefore the description of them will be avoided hereinafter.

Like the fourth embodiment mentioned above, the analog-to-digital converting device 10 has the eight A/D converted result storing registers 22a–22h which correspond to the 8-channel internal analog input terminals 1, respectively. Therefore, in the operation by use of the built-in channels, digital data converted from analog signals present at the channels CH0–CH7 are stored in the A/D converted result bits 23 of the A/D converted result storing registers 22a–22h, respectively. Simultaneously, the bits b10–b12 among the converted channel indicating bits 25 of each of the A/D converted result storing registers 22a–22h are set to the same values as those of the three bits b0–b2 of the current channel control word. Furthermore, the bit b13 of the converted channel indicating bits 25 of each register is set to logical state 0 so as to indicate that a digital data stored in each A/D converted result storing register is converted from an analog signal present at a corresponding internal channel. On the other hand, when an analog signal input through one channel of the external analog input terminals 12 shown in FIG. 2 is converted into a digital signal, the bits b10–b12 among the converted channel indicating bits 25 of a corresponding one of the A/D converted result storing registers 22a–22h are set to the same values as those of the three bits b0–b2 of the current channel control word. Furthermore, the bit b13 of the converted channel indicating bits 25 is set to logical state 1 and the converted result is stored in the A/D converted result bits 23 of the A/D converted result storing register.

Thus, the analog-to-digital converting device according to this embodiment can eliminate the need for monitoring through which channel an analog signal which corresponds to an A/D converted result is input by means of a software program because it can gain a knowledge about the number of a channel through which each analog signal is input as well as through which channel, i.e., either an internal channel or an external channel, the analog signal which corresponds to the A/D converted result is input, by checking the digital values of the converted channel indicating bits 25.

Figure 7:
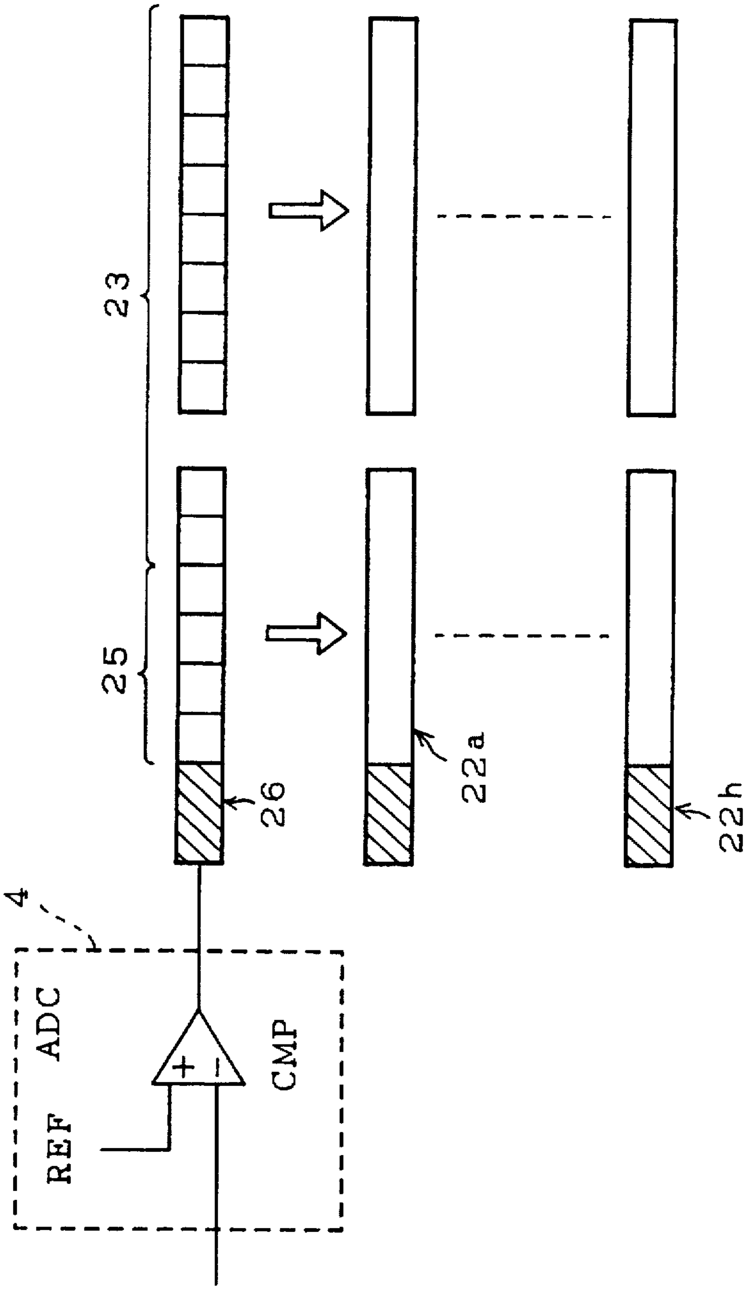
FIG. 7 shows a schematic diagram of an A/D successive approximations register disposed in an analog-to-digital converting device according to the sixth embodiment of the present invention.

Referring now to FIG. 7, it illustrates a schematic diagram showing the structure of an A/D successive approximations register in an analog-to-digital converting device according to the sixth embodiment of the present invention. In the figure, like elements are designated by the same reference numerals as those in FIGS. 1, 5 and 6 and hence the explanation of them will not be repeated. Additionally, the A/D successive approximations register (SAR) is designated by reference numeral 26. The input terminal of the SAR 26 is connected to the output terminal of the A/D converter 4. According to this embodiment the structure of the analog-to-digital converting device is the same as that of the first embodiment shown in FIG. 1 and the operation with the internal or external channels is the same as that of the first embodiment, and therefore the description of them will be avoided hereinafter.

Like the eight A/D converted result storing registers 22a–22h of the fifth embodiment mentioned above, the upper four bits of the SAR 26 are assigned to the converted channel indicating bits 25 and the lower ten bits are assigned to the A/D converted result bits 23. In the operation by use of the built-in channels, the analog-to-digital converted value of an analog signal present at any one of the channels CH0–CH7 of the analog input terminals 1 is stored in the A/D converted result bits 23 of the SAR 26. Simultaneously, the bits b10–b12 among the upper converted channel indicating bits 25 of the SAR 26 are set to the same values as those of the three bits b0–b2 of the current channel control word. Furthermore, the bit b13 of the converted channel indicating bits 25 of the register is set to logical state 0 so as to indicate that the digital data stored in the SAR 26 is converted from an analog signal present at a corresponding internal channel. On the other hand, when an analog signal input through one channel of the external analog input terminals 12 shown in FIG. 2 is converted into a digital signal, the bits b10–b12 of the converted channel indicating bits 25 of the SAR 26 are set to the same values as those of the three bits b0–b2 of the current channel control word. Furthermore, the bit b13 of the converted channel indicating bits 25 is set to logical state 1 and the A/D converted result is stored in the lower A/D converted result bits 23 of the SAR 26.

The contents of the SAR 26 are transferred to a corresponding one of the A/D converted result storing registers 22a–22h, just as they are. That is, the analog-to-digital converted data is stored in the A/D converted result bits 23 of the corresponding one of the A/D converted result storing registers 22a–22h. Simultaneously, the bits b10–b12 of the converted channel indicating bits 25 of the A/D converted result storing register are set to the same values as those of the three bits b0–b2 of the current channel control word. Furthermore, the bit b13 of the converted channel indicating bits 25 of the register is set to logical state 0 so as to indicate that the digital data stored in the A/D converted result storing register is converted from an analog signal present at a corresponding internal channel. On the other hand, when an analog signal input through one channel of the external analog input terminals 12 shown in FIG. 2 is converted into a digital signal, the bits b10–b12 of the converted channel indicating bits 25 of the A/D converted result storing register are set to the same values as those of the three bits b0–b2 of the current channel control word. Furthermore, the bit b13 of the converted channel indicating bits 25 is set to logical state 1 and the A/D converted result is stored in the A/D converted result bits 23 of the A/D converted result storing register.

Thus, the analog-to-digital converting device according to this embodiment can eliminate the need for monitoring through which channel an analog signal which corresponds to an A/D converted result is input by means of a software program because it can gain a knowledge about the number of a channel through which each analog signal is input as well as through which channel, i.e., either an internal channel or an external channel, an analog signal which corresponds to an A/D converted result is input, by checking the digital values of the converted channel indicating bits 25 of the SAR and A/D converted result storing registers 22a–22h.

Figure 8:
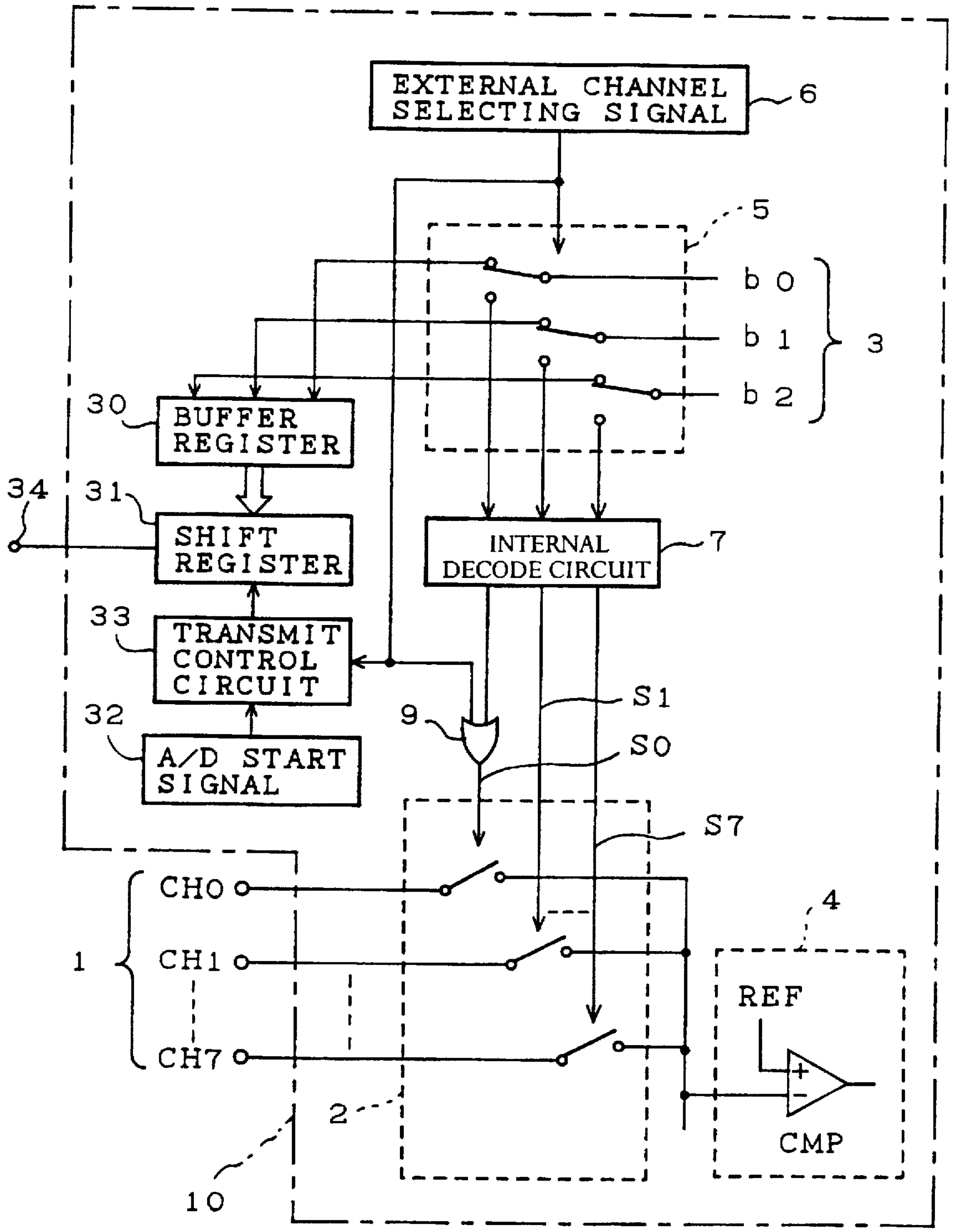
FIG. 8 shows a block diagram of an analog-to-digital converting device according to the seventh embodiment of the present invention.
Figure 9:
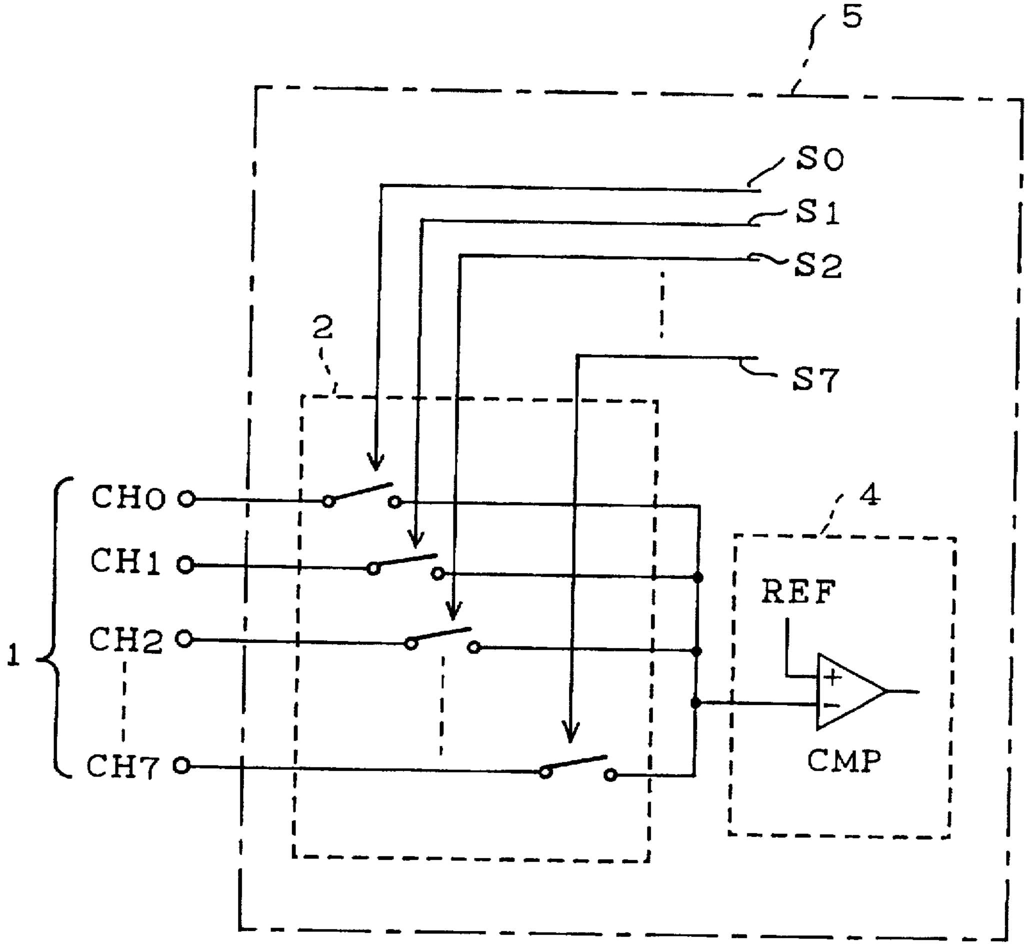
FIG. 9 (PRIOR ART)
FIG. 9 shows a block diagram of a prior art analog-to-digital converting device.

Referring now to FIG. 8, it illustrates a block diagram showing the structure of an analog-to-digital converting device according to the seventh embodiment of the present invention. In the figure, like elements are designated by the same reference numerals as those in FIG. 1 and hence the explanation of them will not be repeated. Additionally, reference numeral 30 denotes a buffer register for temporarily storing the channel control word 3 in order to transmit it to outside the device, 31 denotes a shift register for serially outputting the channel control word 3 stored in the buffer register 30, 32 denotes an A/D start signal, 33 denotes a transmit control circuit which triggers the shift register 31 to deliver the channel control word 3 to outside the device in response to the A/D start signal 32 when receiving the external channel selecting signal 3 which selects external channels, and 34 denotes a serial channel control word output terminal through which the channel control word 3 is output.

Next, the description will be directed to the operation of the analog-to-digital converting device. The operation with the internal input channels according to this embodiment is the same as that of the first embodiment, and therefore the description of this operation will be avoided hereinafter. As previously mentioned in the first embodiment, when the external channel selecting signal 6 is asserted High, the switches 5 are switched to deliver the 3-bit channel control word 3 to the channel control word output terminal 8. In this case, none of the built-in channel selecting signals S0–S7 is delivered from the internal decode circuit 7 to the multiplexer 2. Simultaneously, the external channel selecting signal 6 is applied to one input terminal of the OR gate 9. A high logical level signal is output from the OR gate 9 and is then applied to the channel CH0 switch of the multiplexer 2 and transmit control circuit 33 so as to switch the switch on and activate the transmit control circuit 33. When the A/D start signal 32 is applied to the transmit control circuit 33, the transmit control circuit 33 triggers the shift register 33 to serially deliver the channel control word 3 stored in the buffer register 30 to the decode circuit disposed outside the device by way of the serial channel control word output terminal 34.

An analog signal present at a selected one of the plural external analog input terminals included in the external decode circuit is input to the channel CH0 of the analog input terminals 1. The analog signal is further input to the A/D converter 4 by way of the multiplexer 2. Thus, the A/D converter 4 converts analog signals applied to the external analog input terminals disposed outside the device into digital signals.

The logical state of the external channel selecting signal 6 is controlled by a software program. The software program causes the external channel selecting signal 6 to transition to its high logical state when converting an analog signal present at one external analog input terminal included in the external device into a digital signal. Instead, the software program causes the external channel selecting signal 6 to transition to its low logical state when converting an analog signal present at one built-in analog input terminal 1 into a digital signal.

The structure of the decode circuit disposed outside the analog-to-digital converting device of this embodiment is substantially similar to that of the external decode circuit shown in FIG. 2 except that it has only one channel control word input terminal and it needs a circuit for converting the channel control word transmitted serially into three parallel signals.

According to this embodiment, the channel control word 3 composed of a plurality of bits can be output through a single output terminal and therefore the structure of the analog-to-digital converting device can be simplified.

As previously mentioned, the present invention offers many advantageous effects.

Since there is provided an analog-to-digital converting device comprising an external channel control mechanism, responsive to an external channel selecting signal applied thereto, for changing the destination of the channel control word from an internal decode circuit to outside the analog-to-digital converting device and for controlling the multiplexer so as to select one predetermined analog input terminal from among a plurality of analog input terminals for analog-to-digital conversion, it makes it possible to substantially increase the number of analog input channels without increasing the number of the built-in analog input terminals.

In accordance with a preferred embodiment of the present invention, an empty bit of a channel selecting register which determines the logical states of the bits of the channel control word is assigned to a data for controlling the logical state of the external channel selecting signal. Therefore, it makes it possible to automatically switch from the built-in analog input terminals to the external channel input terminals, through which analog signals are input and they are sent to the A/D converter by way of the predetermined internal analog input terminal.

Also, in a preferred embodiment of the present invention, the analog-to-digital converting device comprises a control input terminal which receives the external channel selecting signal. Therefore, the load on the software program which controls the operation of the analog-to-digital converting device can be reduced.

According to a preferred embodiment of the present invention, an empty bit of each of the plural A/D converted result storing registers is assigned to a data for showing whether or not each A/D converted result stored in each A/D converted result storing register is converted from an analog signal applied to the predetermined analog input terminal under control of the external channel control mechanism. Therefore, the device can gain a knowledge about through which channel, i.e., either an internal channel or an external channel, the analog signal which corresponds to the analog-to-digital converted result is input without monitoring through which channel analog signals, which correspond to digital data in the A/D converted result storing registers, are input by a software program.

Also, in a preferred embodiment of the present invention, a plurality of empty bits of each of the plural A/D converted result storing registers are assigned to a data for showing whether or not each A/D converted result stored in each A/D converted resultsstoring register is converted from an analog signal applied to the predetermined analog input terminal under control of the external channel control mechanism and data for showing the logical states of the bits of the channel control word. Therefore, the device can gain a knowledge about the number of a channel through which each analog signal is input as well as through which channel, i.e., either an internal channel or an external channel, the analog signal which corresponds to the analog-to-digital converted result is input, without monitoring through which channel analog signals, which correspond to digital data in the A/D converted result storing registers, are input by a software program.

According to a preferred embodiment of the present invention, the analog-to-digital converting device further comprises an A/D successive approximations register for storing an A/D converted result, a plurality of bits of the A/D successive approximations register being assigned to a data for showing whether or not an A/D converted result stored in the A/D successive approximations register is converted from an analog signal applied to the predetermined analog input terminal under control of the external channel control mechanism and data for showing the logical states of the bits of the channel control word. Furthermore, the A/D converted result and data are transferred to one corresponding A/D converted result storing register, just as they are. Therefore, the device can gain a knowledge about the number of a channel through which each analog signal is input as well as through which channel, i.e., either an internal channel or an external channel, the analog signal which corresponds to the analog-to-digital converted result is input, without monitoring through which channel analog signals, which correspond to digital data in the A/D converted result storing registers, are input by a software program.

In a preferred embodiment of the present invention, the analog-to-digital converting device further comprises output terminals for receiving the channel control word under control of the external channel control mechanism and for delivering the bits of the word in parallel with each other to outside the device. Therefore, since it is not necessary to provide a circuit for converting the channel control word, typically composed of a plurality of bits, into a continuous sequence of signals, the structure of the device can be simplified.

Preferably, the analog-to-digital converting device includes an output mechanism which receives the channel control word under control of the external channel control mechanism and sequentially delivers the bits of the word to outside the device. Therefore, the number of the output terminals can be decreased.

Furthermore, according to the present invention, there is provided an analog-to-digital converting device comprising an external channel control mechanism, responsive to an external channel selecting signal applied thereto, for changing the destination of the channel control word from the first decode circuit to the second decode circuit and for controlling the multiplexer so as to select one predetermined analog input terminal from among the plural analog input terminals for analog-to-digital conversion. Therefore, since it is not necessary to provide an external device disposed outside the analog-to-digital converting device with another decode circuit, the structure of the external device can be simplified.

Many widely different embodiments of the present invention may be constructed without departing from the spirit and scope of the present invention. It should be understood that the present invention is not limited to the specific embodiments described in the specification, except as defined in the appended claims.

What is claimed is:

1. An analog-to-digital converting device comprising:

a decode circuit which decodes a channel control word to select one input channel from among a plurality of input channels to produce a corresponding channel selecting signal;

a multiplexer which selects one analog input terminal from among a plurality of analog input terminals according to the channel selecting signal output by said decode circuit to transmit an analog signal applied to the selected analog input terminal for analog-to-digital conversion; and external channel control means, responsive to an external channel selecting signal applied thereto, for changing the destination of the channel control word from said decode circuit to an external decode circuit located outside said analog-to-digital converting device via a channel control output terminal and for controlling said multiplexer so as to select one predetermined analog input terminal from among the plurality of analog input terminals for analog-to-digital conversion, at least one of the plurality of analog input terminals coupled to one analog output terminal of said external decode circuit.

2. The analog-to-digital converting device according to claim 1, further comprising a channel selecting register which determines logical states of the channel control word wherein said channel selecting register has a bit for controlling the logical state of the external channel selecting signal.

3. The analog-to-digital converting device according to claim 2, wherein said device comprises a plurality of A/D converted result storing registers, the number of which are equal to the number of the analog input terminals, and wherein a bit of each of said plurality of A/D converted result storing registers is assigned to a data for showing whether or not each A/D converted result stored in each A/D converter storing register is converted from an analog signal applied to the predetermined analog input terminal under control of said external channel control means.

4. The analog-to-digital converting device according to claim 2, wherein said device comprises a plurality of A/D converted result storing registers, the number of which are equal to the number of the analog input terminals, and wherein a plurality of bits of each of said plurality of A/D converted result storing registers are assigned to a data for showing whether or not each A/D converted result stored in each A/D converted result storing register is converted from an analog signal applied to the predetermined analog input terminal under control of said external channel control means and data for showing the logical states of bits of the channel control word.

5. The analog-to-digital converting device according to claim 4, wherein said device further comprises an A/D successive approximations register for storing an A/D converted result, a plurality of bits of the A/D successive approximations register being assigned to a data for showing whether or not an A/D converted result stored in the A/D successive approximations register is converted from an analog signal applied to the predetermined analog input terminal under control of said external channel control means and data for showing the logical states of bits of the channel control word, and wherein the A/D converted result and data are transferred to said one corresponding A/D converted result storing register.

6. The analog-to-digital converting device according to claim 2, wherein said device further comprises output terminals for delivering bits of the channel control word in parallel with each other to outside said device, said channel control word under control of said external channel control means.

7. The analog-to-digital converting device according to claim 2, wherein said device further comprises an output means for receiving the channel control word under control of said external channel control means and for serially delivering bits of the channel control word to outside said device.

8. The analog-to-digital converting device according to claim 1, wherein said device comprises a control input terminal which receives the external channel selecting signal.

9. The analog-to-digital converting device according to claim 8, wherein said device comprises a plurality of A/D converted result storing registers, the number of which are equal to the number of the analog input terminals, and wherein a bit of each of said plurality of A/D converted result storing registers is assigned to a data for showing whether or not each A/D converted result stored in each A/D converted result storing register is converted from an analog signal applied to the predetermined analog input terminal under control of said external channel control means.

10. The analog-to-digital converting device according to claim 8, wherein said device comprises a plurality of A/D converted result storing registers, the number of which are equal to the number of the analog input terminals, and wherein a plurality of bits of each of said plurality of A/D converted result storing registers are assigned to a data for showing whether or not each A/D converted result stored in each A/D converted result storing register is converted from an analog signal applied to the predetermined analog input terminal under control of said external channel control means and data for showing the logical states of bits of the channel control word.

11. The analog-to-digital converting device according to claim 10, wherein said device further comprises an A/D successive approximations register for storing an A/D converted result, a plurality of bits of the A/D successive approximations register being assigned to a data for showing whether or not an A/D converted result stored in the A/D successive approximations register is converted from an analog signal applied to the predetermined analog input terminal under control of said external channel control means and data for showing the logical states of bits of the channel control word, and wherein the A/D converted result and data are transferred to said one corresponding A/D converted result storing register.

12. The analog-to-digital converting device according to claim 8, wherein said device further comprises output terminals for delivering bits of the channel control word in parallel with each other to outside said device, said channel control word under control of said external channel control means.

13. The analog-to-digital converting device according to claim 8, wherein said device further comprises an output means for receiving the channel control word under control of said external channel control means and for serially delivering bits of the channel control word to outside said device.

14. The analog-to-digital converting device according to claim 1, wherein said device comprises a plurality of A/D converted result storing registers, the number of which are equal to the number of the analog input terminals, and wherein a bit of each of said plurality of A/D converter result storing registers is assigned to a data for showing whether or not each A/D converted result stored in each A/D converted result storing register is converted from an analog signal applied to the predetermined analog input terminal under control of said external channel control means.

15. The analog-to-digital converting device according to claim 1, wherein said device comprises a plurality of A/D converted result storing registers, the number of which are equal to the number of the analog input terminals, and wherein a plurality of bits of each of said plurality of A/D converted result storing registers are assigned to a data for showing whether or not each A/D converted result stored in each A/D converted result storing register is converted from an analog signal applied to the predetermined analog input terminal under control of said external channel control means and data for showing the logical states of bits of the channel control word.

16. The analog-to-digital converting device according to claim 15, wherein said device further comprises an A/D successive approximations register for storing an A/D converted result, a plurality of bits of the A/D successive approximations register being assigned to a data for showing whether or not an A/D converted result stored in the A/D successive approximations register is converted from an analog signal applied to the predetermined analog input terminal under control of said external channel control means and data for showing the logical states of bits of the channel control word, and wherein the A/D converted result and data are transferred to said one corresponding A/D converted result storing register.

17. The analog-to-digital converting device according to claim 1, wherein said device further comprises output terminals for delivering bits of the channel control word in parallel with each other to outside said device, said channel control word under control of said external channel control means.

18. The analog-to-digital converting device according to claim 1, wherein said device further comprises an output means for receiving the channel control word under control of said external channel control means and for serially delivering bits of the channel control word to outside said device.

19. An analog-to-digital converting device comprising:

a decode circuit which decodes a channel control word for selecting one input channel from among a plurality of input channels to produce a corresponding channel selecting signal;

a multiplexer which selects one analog input terminal from among a plurality of analog input terminals according to the channel selecting signals output by said decode circuit to transmit an analog signal applied to the selected analog input terminal for analog-to-digital conversion; and external channel control means for serially delivering bits of the channel control word to outside the device, said external channel control means responsive to an external channel selecting signal applied thereto, for changing the destination of the channel control word from said decode circuit to an external decode circuit and for controlling said multiplexer so as to select one predetermined analog input terminal from among the plurality of analog input terminals for analog-to-digital conversion, said external decode circuit located outside said device and which decodes the channel control word to produce and deliver a corresponding channel selecting signal to said device by way of one output terminal.

* * * * *